(12) United States Patent
Hintermaier

(10) Patent No.: US 7,122,856 B1
(45) Date of Patent: Oct. 17, 2006

(54) CAPACITOR HAVING A BARRIER LAYER MADE OF A TRANSITION METAL PHOSPHIDE, ARSENIDE OR SULFIDE

(75) Inventor: Frank Hintermaier, München (DE)

(73) Assignee: Infineon Technologies AG, Munich (DE)

( * ) Notice: Subject to any disclaimer, the term of this patent is extended or adjusted under 35 U.S.C. 154(b) by 1243 days.

(21) Appl. No.: 09/161,196

(22) Filed: Sep. 25, 1998

(30) Foreign Application Priority Data

Sep. 30, 1997 (DE) ............................... 197 43 268

(51) Int. Cl.
*H01L 27/108* (2006.01)
*H01L 29/76* (2006.01)
*H01L 29/94* (2006.01)
*H01L 31/119* (2006.01)

(52) U.S. Cl. ..................... 257/306; 257/308
(58) Field of Classification Search ........ 257/295–310; 438/396–399, 243–253; 361/305–310
See application file for complete search history.

(56) References Cited

U.S. PATENT DOCUMENTS

| 5,293,510 | A |   | 3/1994  | Takenaka |         |
|-----------|---|---|---------|----------|---------|
| 5,384,470 | A | * | 1/1995  | Tachibana et al. | 257/77 |
| 5,478,416 | A | * | 12/1995 | Takaoka et al.   | 148/306 |
| 5,566,045 | A | * | 10/1996 | Summerfelt et al.| 361/305 |
| 5,668,040 | A | * | 9/1997  | Byun             | 438/396 |
| 5,691,219 | A | * | 11/1997 | Kawakubo et al.  | 438/396 |
| 5,705,685 | A | * | 1/1998  | Lyons et al.     | 562/549 |
| 5,990,348 | A | * | 11/1999 | Lyons et al.     | 562/549 |
| 6,015,997 | A | * | 1/2000  | Hu et al.        |         |
| 6,043,184 | A | * | 3/2000  | Karmakar et al.  | 502/208 |
| 6,060,419 | A | * | 5/2000  | Wijesekera et al.| 502/208 |

FOREIGN PATENT DOCUMENTS

| DE | 196 49 684 C1 | 9/1997 |
| EP | 0 697 720 A1  | 2/1996 |
| EP | 0 726 600 A2  | 8/1996 |

OTHER PUBLICATIONS

Seiji Motojima et al.: "Corrosion stability of vapour-deposited transition metal phosphides at high temperature", Journal of the Less-Common Metals, 82 (1981), pp. 379-383.
Koichi Takemura et al.: "RuO$_2$/Tin-Based Storage Electrodes for (Ba, Sr)TiO$_3$ Dynamic Random Access Memory Capacitors", Jpn. J. Appl. Phys. vol. 34 (1995) pp. 5224-5229, part 1, No. 9B, Sep. 1995.
R. L. Ripley: "The Preparation And Properties Of Some Transition Phosphides", Journal of the Less-Common Metals, vol. 4, 1962, pp. 496-503.
I.M. Watson et al.: "Chromium-phosphorus films deposited by the pyrolysis of an organometallic precursor", Thin Solid Films, vol. 196, No. 1, Feb. 1, 1991, pp. L21-L24.

(Continued)

*Primary Examiner*—Cuong Nguyen
(74) *Attorney, Agent, or Firm*—Laurence A. Greenberg; Werner H. Stemer; Ralph E. Locher

(57) ABSTRACT

The capacitor has a capacitor dielectric formed, in particular, as a high-☐-dielectrical or ferroelectrical layer. A barrier layer is formed of a compound of a transition element with phosphorus, sulfur or arsenic. The barrier layer is underneath the capacitor dielectric. The barrier layer is oxygen-impermeable and thus prevents the oxidation of deep structures during high-temperature processes, in particular during the production of the capacitor dielectric.

12 Claims, 2 Drawing Sheets

OTHER PUBLICATIONS

S. Motojima et al.: "Chemical vapour growth of HfP whiskers and their properties", Journal of materials Science, vol. 31, 1996, pp. 5709-5715.

T. Suren Lewkebandara et al.: "Precursor for the Low-Temperature Deposition of Titanium Phosphide Films", Chem. Mater., 1995, No. 7, pp. 1053-1054.

* cited by examiner

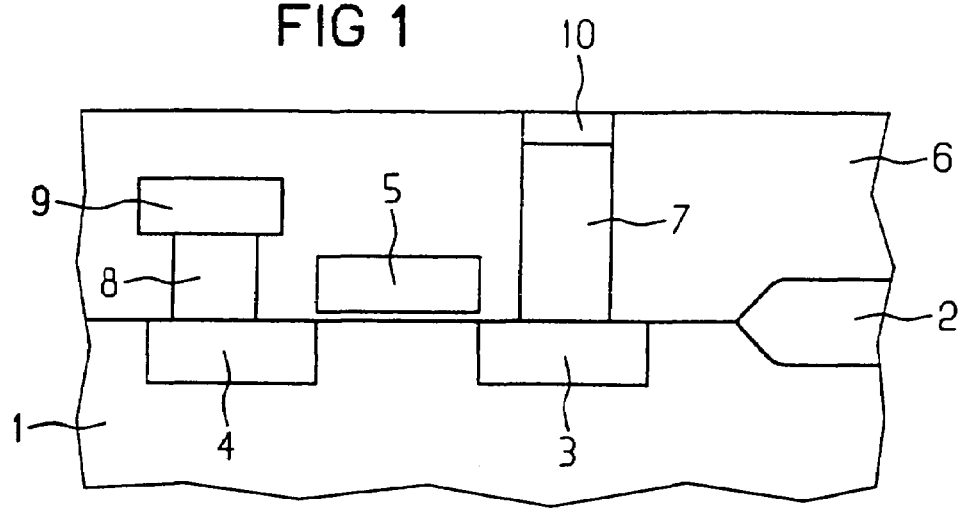
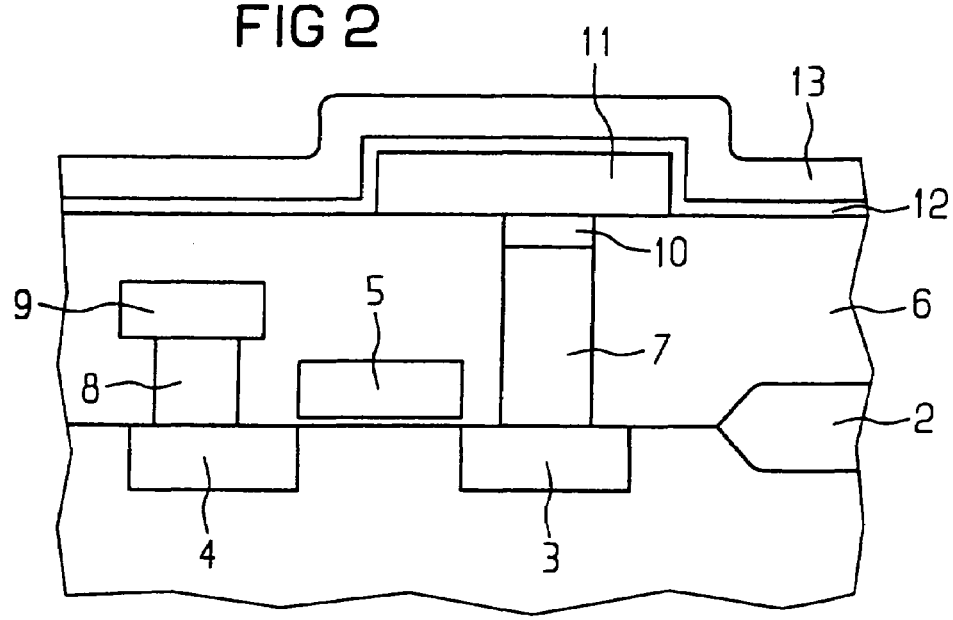

CAPACITOR HAVING A BARRIER LAYER MADE OF A TRANSITION METAL PHOSPHIDE, ARSENIDE OR SULFIDE

BACKGROUND OF THE INVENTION

Field of the Invention

The invention relates to a capacitor in an integrated circuit, in particular in an integrated semiconductor memory.

In integrated circuits, the need often arises to produce a capacitor which requires little space but has a sufficiently high capacitance. For this reason, use is being increasingly made of ceramic thin films with high dielectric constant for the capacitor dielectric. These are usually oxides, for example strontium titanate (ST) or barium strontium titanate (BST) with typical □ values in the range from 200 to 600. If a capacitor with ferroelectric memory properties is desired, a ceramic layer with suitable ferroelectric properties, for example strontium bismuth tantalate (SBT), is used for the capacitor dielectric. As described, for example, in Japanese Journal of Applied Physics, Vol. 34 (1995), pages 5224–29, these ceramic layers are usually produced by high-temperature processes in an atmosphere containing oxygen.

Therefore, at least the lower (first) electrode, to which the dielectric is applied, must be stable under these conditions. Platinum, platinum-group metals (Ru, Ir) or electrically conductive metal oxides ($RuO_2$, $IrO_2$) have proved suitable. However, those electrode materials are permeable to oxygen, so that the surface of adjoining structures may be oxidized, for example in the aforementioned high-temperature process. If the first electrode, as is conventional, in the case of a connection structure made of polysilicon or tungsten, is connected to other circuit elements of the integrated circuit, the boundary layer between the connection structure and the electrode oxidizes, as a result of which the resistance is increased considerably or an electrical break takes place. If TiN is used as a silicon diffusion barrier under the electrode, this oxidizes during the high-temperature process, as likewise explained in the literature reference cited above.

SUMMARY OF THE INVENTION

It is accordingly an object of the invention to provide a capacitor with a barrier layer of a transition metal phosphide, arsenide, or sulphide, which overcomes the above-mentioned disadvantages of the heretofore-known devices and methods of this general type, which has high capacitance while requiring little area, and wherein the above problems do not arise.

With the foregoing and other objects in view there is provided, in accordance with the invention, a capacitor in an integrated semiconductor circuit, comprising:

a semiconductor substrate having a doped region formed therein;

a first electrode connected (directly or via a connection structure) to the doped region;

a second electrode;

a capacitor dielectric insulating the first electrode from the second electrode; and a barrier layer disposed below the capacitor dielectric, the barrier layer consisting essentially of a compound formed from a transition element and a material selected from the group consisting of phosphorus, sulfur, and arsenic.

The invention relies on the use of a barrier layer, which essentially consists of a compound formed between a transition element (first to eighth sub-groups of the Periodic Table), on the one hand, and phosphorus, sulfur or arsenic, on the other hand. In other words, transition metal phosphides, sulfides or arsenides are involved. The barrier layer must be electrically conductive and exhibit sufficient resistance to oxidation, and must also sufficiently reduce the diffusion of oxygen. These are proven properties of these categories of materials. The phosphides of the early transition elements (Ti, Zr, Hf, V, Nb, Ta, Cr, Mo, W) are in particular known for high stability with respect to acids and alkalis and with respect to oxidation (S. Motojima, T. Wakamatsu, K. Sugiyama, J. Less Comm. Met. 1981, 82, 379 and S. Motojima et al., J. Mater. Sci. 1996, 31(21), pp. 5709–15). For example, the temperature limits up to which the compounds are stable with respect to oxidation in air are 350° C. for TiP, 450° C. for MoP, 600° C. for WP and 1000° C. for HfP. The decomposition temperatures are also very high (in excess of 1300° C.). Many phosphides are more stable than the corresponding nitrides (for example CrP, MoP, WP). They are further conductive, the resistivity (specific resistance) at room temperature being usually a few m□/cm (R. L. Ripley, J. Less Comm. Met. 1962, 4, 496). The properties of the transition metal sulfides and arsenides are basically similar to those of the corresponding phosphides.

Mixtures of said compounds may also be used for the barrier, for example WP/TiP. Said compounds may further—to achieve desired properties—be doped, in particular with other metals.

As regards the production of layers of said materials, both physical processes, for example sputtering processes, and chemical methods, for example CVD, are available. The article by I. M. Watson, J. A. Connor, R. Whyman, Thin Solid Films, 1991, 196, L21 describes a CVD method for the production of CrP, which uses $Cr(CO)_5(PH_3)$ as precursor in an oven (200 to 350° C., 0.8 torr), a deposition rate of a few μ/h being obtained. For the production of TiP on silicon or silicon oxide, the article by C. H. Winter, T. S. Lewkebandara, J. W. Proscia, Chem. Mater. 1995, 7, 1053 describes a deposition method which commences with $TiCl_4(PH_2Cy)_2$ as starting material (Cy=cyclohexyl). Further data relating to the process are a temperature of from 350 to 600° C. and a pressure of 0.1 torr. Further production processes are given in the illustrative embodiments.

Sulfides and arsenides may be produced in a similar way, that is to say, in particular, by heat treatment in an atmosphere which contains $H_2S$ or $AsH_3$, respectively, or by a CVD process with the metal chlorides, $H_2$ and $H_2S$ or $AsH_3$, respectively.

In accordance with an added feature of the invention, the barrier layer is disposed directly underneath the capacitor dielectric and covers an entire interface between the first electrode and the capacitor dielectric or, if applicable, an entire interface between the first electrode and the connection structure.

In accordance with an additional feature of the invention, the barrier layer is disposed underneath the first electrode and covers an entire interface between the first electrode and the doped region.

In other words, the barrier layer is arranged below the capacitor dielectric and above the next structure which is not resistant to oxidation. If the optional connection structure is provided, then the barrier layer is preferably arranged above the latter, that is to say between the connection structure and the first electrode, or between the first electrode and the capacitor dielectric.

In the case of a connection structure made of a material which is resistant to oxidation, the barrier layer may also be arranged below the latter, that is to say at the interface with this substrate. If there is no connection structure, the barrier layer may also be arranged between the electrode and the substrate. In any case, the barrier layer must be arranged and dimensioned in such a way that, during the production of the capacitor dielectric, diffusion paths for oxygen are effectively broken. It must thus always cover the entire interface between the relevant structures (for example at least the entire interface between the first electrode and the capacitor dielectric, or between the connection structure and the first electrode).

In accordance with another feature of the invention, the capacitor dielectric consists of a material selected from the group consisting of dielectric material and ferroelectric material, and has a value of □>100. Preferably, the capacitor dielectric is formed of BST ($(Ba,Sr)TiO_3$), SBT ($SrBi_2Ta_2O_9$), PZT ($Pb(Zr,Ti)O_3$), or PLT (La-doped PZT).

In accordance with a further feature of the invention, the first electrode consists of a Pt-containing, Ru-containing, Rh-containing, or Ir-containing material.

In accordance with again an added feature of the invention, the connection structure is made of a material selected from the group consisting of polysilicon and tungsten.

In accordance with again another feature of the invention, the barrier layer is essentially a layer selected from the group consisting of a tungsten phosphide layer, a tantalum phosphide layer, and a hafnium phosphide layer.

In accordance with again a further feature of the invention, there is provided a semiconductor device which comprises the above capacitor and an associated selection transistor which comprises the doped region.

With the above and other objects in view there is also provided, in accordance with the invention, a method of producing a capacitor in an integrated semiconductor circuit, which comprises:

producing a first electrode on a semiconductor substrate and connecting, directly or via a connection structure, the first electrode to a doped region in the semiconductor substrate;

forming a barrier layer consisting essentially of a compound formed between a transition element and a material selected from the group consisting of phosphorus, sulfur, and arsenic, and covering an entire exposed surface of the doped region or of the connection structure with the barrier layer;

producing a capacitor dielectric on the first electrode; and producing a second electrode on the capacitor dielectric.

In accordance with yet another feature of the invention, the barrier layer is produced by heat treatment in a $pH_3$ atmosphere on an electrode consisting of tungsten or on a connection structure consisting of tungsten.

In accordance with yet an additional feature of the invention, the barrier layer is produced by CVD (Chemical Vapor Deposition).

In accordance with yet an additional feature of the invention, the barrier layer is applied surface-wide and is structured in an etching process with the use of the first electrode as a mask.

There is also provided, in accordance with the invention, a further method of producing a capacitor in an integrated semiconductor circuit, which comprises:

producing a first electrode on a semiconductor substrate, the first electrode being connected directly or via a connection structure to a doped region in the semiconductor substrate;

producing a barrier layer on the first electrode, the barrier layer consisting essentially of a compound formed between a transition element and an element selected from the group consisting of phosphorus, sulfur, and arsenic, and covering an entire exposed surface of the first electrode;

producing a capacitor dielectric on the barrier layer; and producing a second electrode on the capacitor dielectric.

This further process may be varied similarly to the first above-noted process.

In the case of use in an integrated semiconductor circuit with a plurality of capacitors, neighboring capacitors must not be short-circuited by the barrier layer. It must therefore be structured in a suitable way. This can be achieved either by selective production or by surface-wide production with subsequent etching. For example, ion milling or sputter etching are suitable, these representing purely physical etching methods. With an alkali etch solution, a wet chemical etching method is also possible.

Other features which are considered as characteristic for the invention are set forth in the appended claims.

Although the invention is illustrated and described herein as embodied in a capacitor having a barrier layer made of a transition metal phosphide, arsenide or sulfide, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic elevational view of a memory cell of an integrated semiconductor circuit, with a capacitor according to a first embodiment of the invention;

FIG. 2 is a similar view thereof at a later production stage; and

DESCRIPTION OF THE PREFERRED EMBODIMENTS

Figure 3:
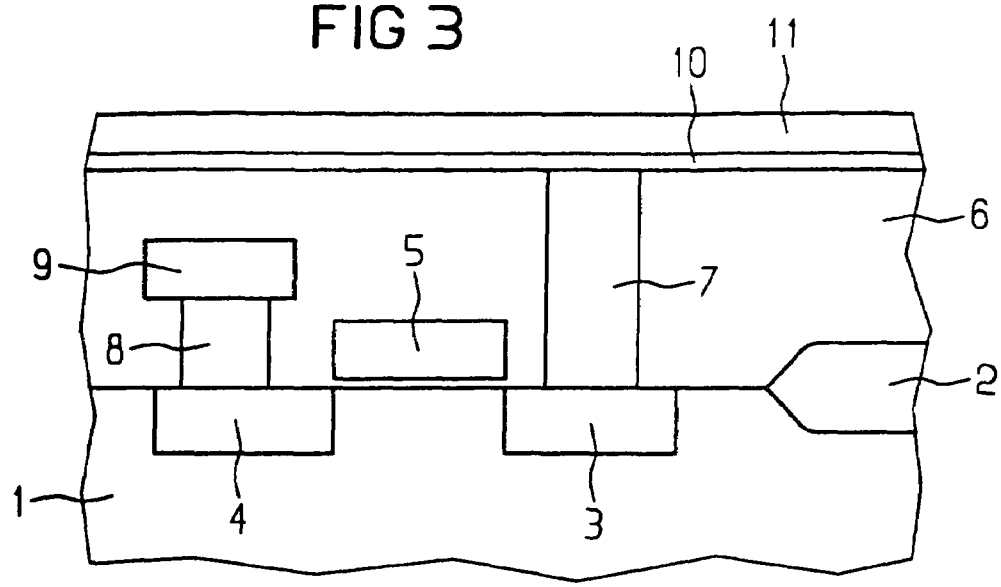
FIGS. 3 and 4 are diagrammatic elevational views of further exemplary embodiments of the invention.

Referring now to the figures of the drawing in detail and first, particularly, to FIG. 1 thereof, there is seen a capacitor that is used as a storage capacitor in an integrated semiconductor memory, in particular a DRAM or FRAM. The figure shows a silicon substrate 1 having, arranged on it, a MOS transistor which comprises two doped regions 3, 4 and a gate 5 that is insulated relative to the substrate. Inactive regions of the circuit are covered with an insulation 2. An insulation layer 6 covers the transistor. A structure 7 connects to the doped region 3. The other doped region 4 is connected via a further connection structure 8 to a bit line 9. In this case, the connection structure 7 consists of tungsten, with which a contact hole etched into the insulation layer 6 is filled. The insulation layer 6 may consist of silicon oxide or nitride. In order to produce the barrier layer, the existing structure is then heat-treated in a $PH_3$ atmosphere. The tungsten W then reacts with the PH$_3$, so that WP 10 is formed self-aligned on the connection structure 7. Typical parameters of the heat treatment are a temperature of from 800 to 1100° C. and a pressure of from 0.1 to 10 torr PH$_3$. Part of the connection structure 7 is thus converted directly into WP. The layer thickness of the barrier 10 can be adjusted through the duration of the heat treatment. A typical value for the thickness of the layer 10 is about 30 nm.

Referring now to FIG. 2, the lower electrode 11 of the capacitor is then applied, for example by sputtering an approximately 30 nm thick Pt layer and suitable structuring. After this, a high-□ dielectric 12 is deposited. During the deposition, the tungsten phosphide acts as a barrier preventing oxygen from diffusing in, and prevents oxidation of the connection structure 7. Lastly, a second electrode 13 of the capacitor is produced, for example from platinum. In the exemplary embodiment, the electrode 13 represents the so-called common plate for all the capacitors.

Referring now to FIG. 3, the second embodiment commences with the same prefabricated basic structure as the first exemplary embodiment, that is to say a substrate having a MOS transistor which is covered with an insulation layer 6, a connection structure 7 being connected, passing through this insulation layer 6, to a doped region 3 of the transistor. The barrier layer 10 is then applied surface-wide to this structure by CVD. To that end, a mixture of tungsten chloride (WCl$_6$), hydrogen (H$_2$) and phosphine (PH$_3$) is produced in a chamber. At a temperature of from 400 to 800° C. and a pressure of from 0.1 to 10 torr, tungsten phosphide (WP) is deposited on the entire surface. As an alternative, tantalum phosphide may also be deposited from the starting materials TaCl$_5$, H$_2$ and PH$_3$ in a CVD process. Platinum is applied on top as the material of the lower electrode 11.

Figure 4:
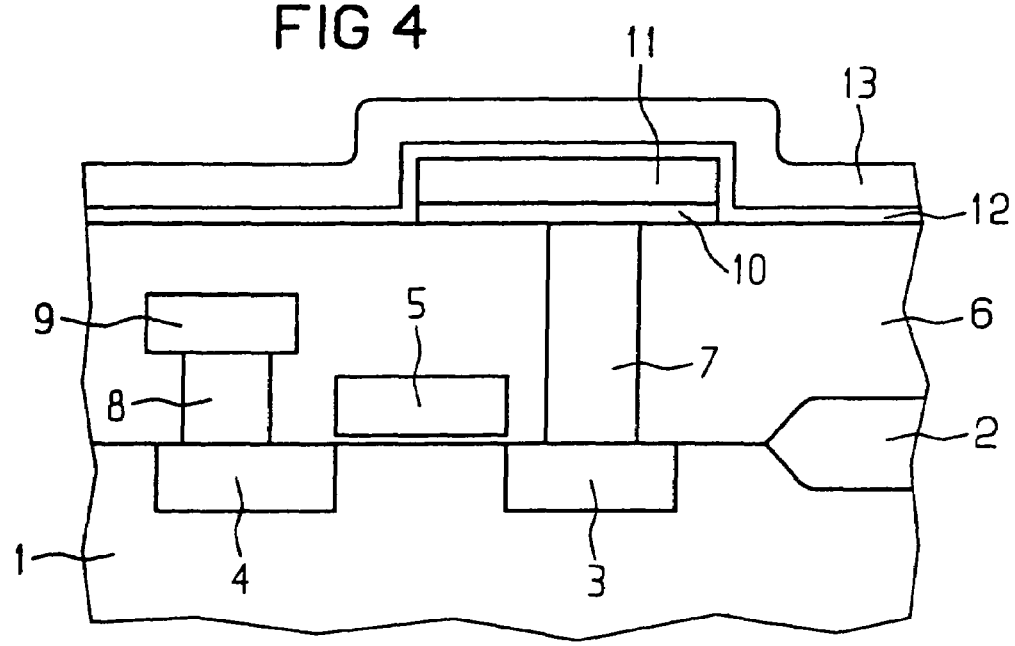

Referring now to FIG. 4, the two layers 10, 11 are structured with the aid of a photographic technique in an etching process, so as to form a first electrode 11 which then lies on the barrier layer 10. As in the first illustrative embodiment, the capacitor is fabricated by production of the capacitor dielectric 12 and of the second electrode 13.

The barrier layer 10 may also be arranged on the first electrode 11. Since, in this case, it also needs to cover the sides of the first electrode, the first electrode is expediently structured initially, and then the barrier layer is applied. The first electrode and the barrier layer may, however, also be structured together, wherein case the sides of the first electrode need to be covered, for example, by a spacer made of the material of the barrier.

I claim:

1. A capacitor in an integrated semiconductor circuit, comprising:
   a semiconductor substrate having a doped region formed therein;
   a first electrode connected to said doped region;
   a second electrode;
   a capacitor dielectric insulating said first electrode from said second electrode; and
   a barrier layer disposed below said capacitor dielectric, said barrier layer consisting essentially of a compound formed from a transition element and a material selected from the group consisting of phosphorus, sulfur, and arsenic.

2. The capacitor according to claim 1, wherein said first electrode is directly connected to said doped region.

3. The capacitor according to claim 1, which further comprises a connection structure connecting said first electrode to said doped region.

4. The capacitor according to claim 1, wherein said barrier layer is disposed directly underneath said capacitor dielectric and covers an entire interface between said first electrode and said capacitor dielectric.

5. The capacitor according to claim 3, wherein said barrier layer is disposed underneath said first electrode and covers an entire interface between said first electrode and said connection structure.

6. The capacitor according to claim 1, wherein said barrier layer is disposed underneath said first electrode and covers an entire interface between said first electrode and said doped region.

7. The capacitor according to claim 1, wherein said capacitor dielectric consists of a material selected from the group consisting of dielectric material and ferroelectric material, and has a value of □>100.

8. The capacitor according to claim 1, wherein said capacitor dielectric consists of a material selected from the group consisting of BST, SBT, PZT, and PLT.

9. The capacitor according to claim 1, wherein said first electrode consists of a material selected from the group consisting of Pt-containing material, Ru-containing material, Rh-containing material, and Ir-containing material.

10. The capacitor according to claim 3, wherein said connection structure is made of a material selected from the group consisting of polysilicon and tungsten.

11. The capacitor according to claim 1, wherein said barrier layer is essentially a layer selected from the group consisting of a tungsten phosphide layer, a tantalum phosphide layer, and a hafnium phosphide layer.

12. A semiconductor configuration, comprising a capacitor according to claim 1, and an associated selection transistor which encompasses said doped region.

\* \* \* \* \*